(12) United States Patent
Onihashi

(10) Patent No.: US 10,156,643 B2
(45) Date of Patent: Dec. 18, 2018

(54) RADIATION DETECTOR

(71) Applicant: Toshiba Electron Tubes & Devices Co., Ltd., Otawara-shi (JP)

(72) Inventor: Hiroshi Onihashi, Nasushiobara (JP)

(73) Assignee: Toshiba Electron Tubes & Devices Co., Ltd., Otawara-shi (JP)

( * ) Notice: Subject to any disclaimer, the term of this patent is extended or adjusted under 35 U.S.C. 154(b) by 0 days.

(21) Appl. No.: 16/006,893

(22) Filed: Jun. 13, 2018

(65) Prior Publication Data
US 2018/0299567 A1  Oct. 18, 2018

Related U.S. Application Data

(63) Continuation of application No. PCT/JP2016/087259, filed on Dec. 14, 2016.

(30) Foreign Application Priority Data

Jan. 6, 2016 (JP) ................................ 2016-000838

(51) Int. Cl.
*G01T 1/20* (2006.01)
*H01L 27/146* (2006.01)
*G01T 1/208* (2006.01)

(52) U.S. Cl.
CPC ............ *G01T 1/208* (2013.01); *G01T 1/2018* (2013.01); *H01L 27/14636* (2013.01); *H01L 27/14663* (2013.01)

(58) Field of Classification Search
CPC . G01T 1/208; G01T 1/2018; H01L 27/14636; H01L 27/14663
See application file for complete search history.

(56) References Cited

U.S. PATENT DOCUMENTS

| 2012/0132820 A1* | 5/2012 | Iwakiri | G01T 1/2018 250/370.08 |
| 2013/0193339 A1* | 8/2013 | Oda | G01T 1/17 250/394 |
| 2015/0034833 A1 | 2/2015 | Blanchon et al. | |

FOREIGN PATENT DOCUMENTS

| JP | 2012-95201 | 5/2012 |
| JP | 2013-157793 | 8/2013 |
| JP | 2014-526178 | 10/2014 |

OTHER PUBLICATIONS

International Search Report dated Mar. 7, 2017 in PCT/JP2016/087259, filed on Dec. 14, 2016 ( with English Translation).
(Continued)

*Primary Examiner* — Michael C Bryant
(74) *Attorney, Agent, or Firm* — Oblon, McClelland, Maier & Neustadt, L.L.P.

(57) ABSTRACT

According to one embodiment, a radiation detector includes a substrate, control lines, data lines, a photoelectric conversion part provided in a region drawn by the control and data lines, and including thin film transistors and photoelectric conversion elements electrically connected to the corresponding control and data lines, a control circuit electrically connected to the control lines, a signal detection circuit electrically connected to the data lines, at least one reference potential part electrically connected to the signal detection circuit, and a determination part electrically connected to the signal detection circuit. The signal detection circuit detects a first current integral value via the data lines and detects a second current integral value from the at least one reference potential part. The determination part determines an incidence start time of a radiation on the basis of a difference between the detected first and second current integral values.

20 Claims, 12 Drawing Sheets

(56) References Cited

OTHER PUBLICATIONS

Written Opinion dated Mar. 7, 2017 in PCT/JP2016/087259, filed on Dec. 14, 2016.

* cited by examiner

RADIATION DETECTOR

CROSS-REFERENCE TO RELATED APPLICATIONS

This is a continuation application of International Application PCT/JP2016/087259, filed on Dec. 14, 2016. This application also claims priority to Japanese Application No. 2016-000838, filed on Jan. 6, 2016. The entire contents of each are incorporated herein by reference.

FIELD

Embodiments described herein relate generally to a radiation detector.

BACKGROUND

There is an X-ray detector as one example of a radiation detector. The X-ray detector is provided with, for example, an array substrate including multiple photoelectric conversion parts (also referred to as pixels), and a scintillator provided on the multiple photoelectric conversion parts and converting an X-ray to fluorescence. The photoelectric conversion part is provided with a photoelectric conversion element converting the fluorescence from the scintillator to a signal charge, a thin film transistor switching storage and release of the signal charge, and a storage capacitor storing the signal charge or the like.

In general, the X-ray detector reads out the signal charge as follows. First, the detector recognizes X-ray incidence from a signal input externally. Next, the detector converts the stored signal charge into a voltage by an integration amplifier and reads out it by turning on a thin film transistor of the photoelectric conversion part performing reading after the passage of a pre-determined time (a time necessary for storing the signal charge).

However, in this way, since start of the operation of the X-ray detector depends on a signal from an external equipment, an external circuit synchronizing the signal from the external equipment (for example, a signal notifying X-ray irradiation from an X-ray source) is necessary. If the external circuit is provided, it is susceptible to noise or the like, in the case where circuit synchronization with the X-ray irradiation is impossible, it may be impossible to acquire an X-ray image.

Here, a thin film transistor as a semiconductor element is irradiated with the X-ray, a current flows due to a photoelectric effect between a drain electrode and a source electrode. The source electrode of the thin film transistor is electrically connected to a data line. Then, there has been proposed a technique detecting the incidence start time of the X-ray by detecting a difference between an integral value of a current flowing in the data line with irradiation of the x-ray and an integral value of a current flowing in the data line with no irradiation of the X-ray.

However, in this way, it results in that a difference between the detected current integral value and the current integral value detected once a time before is obtained. If the current integral value detected once a time before is slightly lower than a threshold value, the difference of the current integral values flowing in the data line is small, and the X-ray may be impossible to be detected. If there is a disturbance noise such as a low frequency noise when converting into the voltage, the voltage values of the respective integration amplifiers are off set. For that reason, the influence of the disturbance noise such as the low frequency noise becomes large, and it may be difficult to detect the incidence start time of the X-ray accurately.

DETAILED DESCRIPTION

Figure 1:
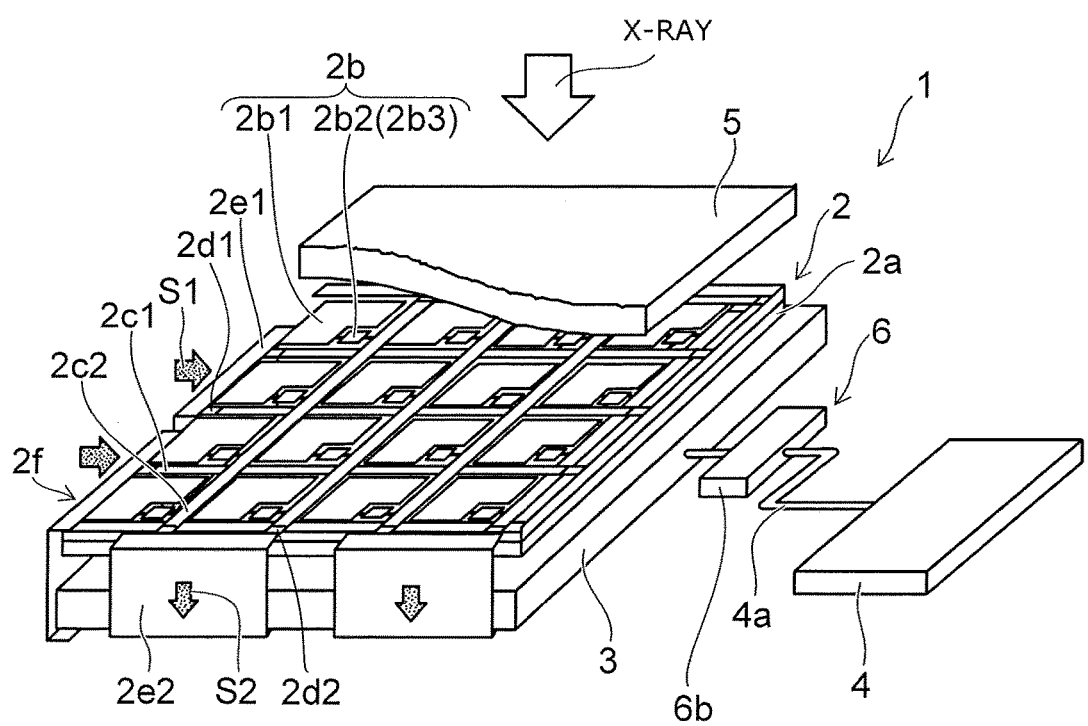
FIG. 1 is a schematic perspective view for illustrating an X-ray detector.

According to one embodiment, a radiation detector includes a substrate, a plurality of control lines provided on the substrate and extending in a first direction, a plurality of data lines provided on the substrate and extending in a second direction crossing the first direction, a photoelectric conversion part provided in each of a plurality of regions drawn by the control lines and the data lines, and including thin film transistor and photoelectric conversion element electrically connected to a corresponding control line and a corresponding data line, a control circuit electrically connected to the control lines, and switching an on state and an off state of the thin film transistors, a signal detection circuit electrically connected to the data lines, at least one reference potential part electrically connected to the signal detection circuit, and a determination part electrically connected to the signal detection circuit. The signal detection circuit detects a first current integral value via the data lines and detects a second current integral value from the reference potential part in the off state of the thin film transistors. The determination part determines an incidence start time of a radiation on the basis of a difference between the detected first current integral value and the detected second current integral value.

Embodiments will be illustrated with reference to the accompanying drawings. In the drawings, similar components are marked with like reference numerals, and the detailed description is omitted as appropriate.

The radiation detector according to the embodiment can be applied to various radiations such as a γ-ray other than an X-ray. Here, the case of the X-ray as a representative of radiations is described as one example. Therefore, the radiation detector can be also applied to other radiation by replacing "X-ray" of the following embodiments with "other radiation".

The X-ray detector 1 illustrated below is an X-ray plane sensor detecting an X-ray image which is a radiation image. The X-ray plane sensor includes a direct conversion method and an indirect conversion method broadly.

The direct conversion method is a method that a photoconductive charge (signal charge) generated inside a photoconductive film by the X-ray incidence is introduced directly to a storage capacitor for charge storage.

The indirect conversion method is a method that the X-ray is converted to fluorescence (visible light) by a scintillator, the fluorescence is converted to the signal charge by a photoelectric conversion element such as a photodiode, and the signal charge is introduced to the storage capacitor.

In the following, the X-ray detector 1 of the indirect conversion method is illustrated as one example, however the invention can be applied to the X-ray detector of the indirect conversion method as well.

That is, the X-ray detector may be a detector including a detection part that detects the X-ray directly or in cooperation with the scintillator.

The X-ray detector 1 can be used for, for example, general medical application or the like, and the application is not limited.

FIG. 1 is a schematic perspective view for illustrating the X-ray detector 1.

In FIG. 1, a bias line 2c3 or the like is omitted.

Figure 2:
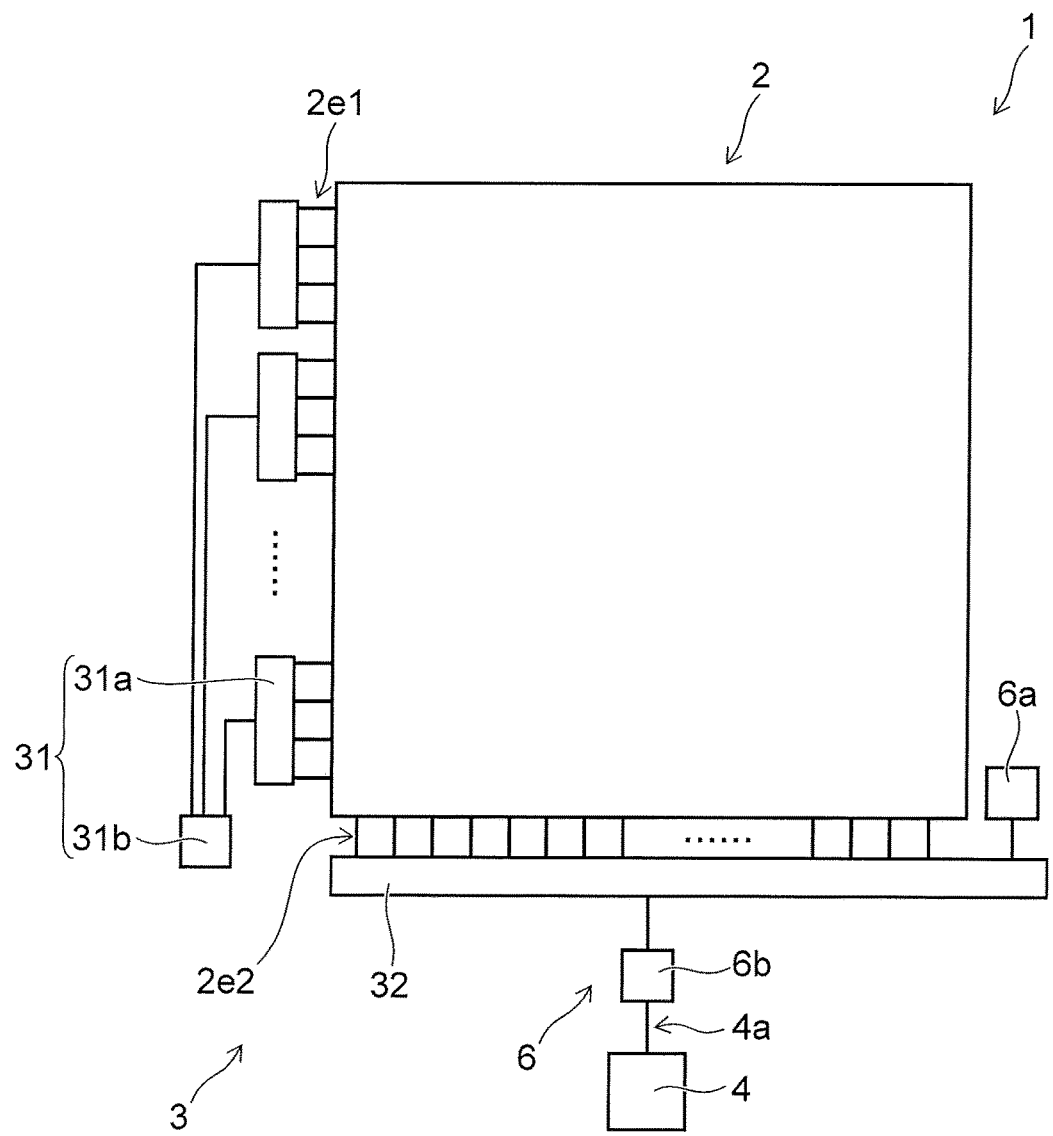
FIG. 2 is a block diagram of the X-ray detector.

FIG. 2 is a block diagram of the X-ray detector 1.

Figure 3:
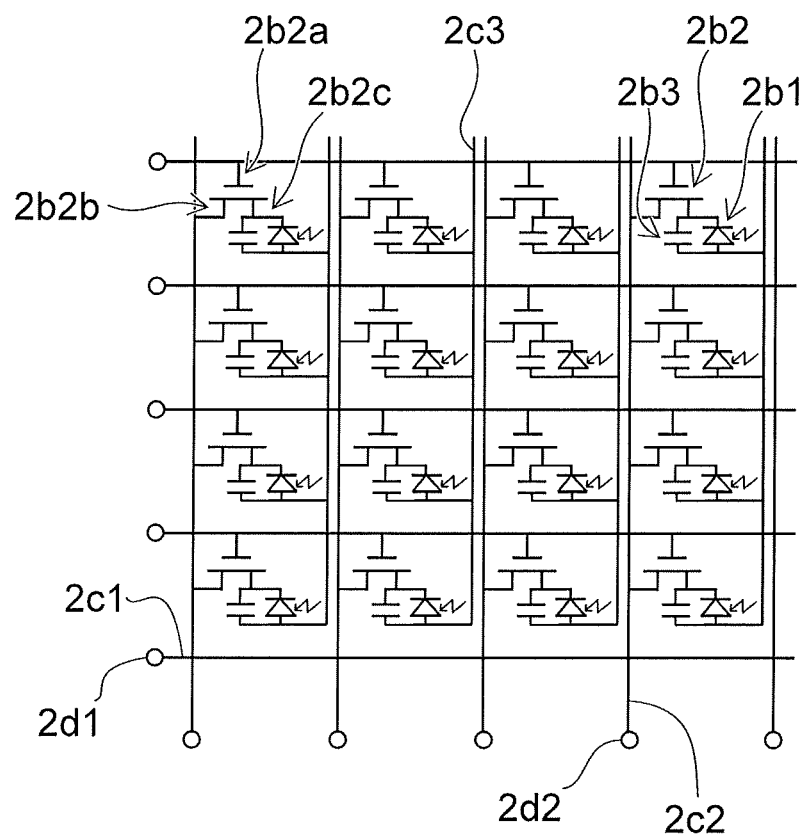
FIG. 3 is a circuit diagram of the X-ray detector.

FIG. 3 is a circuit diagram of the X-ray detector 1.

As shown in FIG. 1 to FIG. 3, the X-ray detector 1 is provided with an array substrate 2, a signal processing part 3, an image processing part 4, a scintillator 5, and an incident radiation detection part 6.

The array substrate 2 converts the fluorescence (visible light) converted from the X-ray by the scintillator 5 to an electric signal.

The array substrate 2 includes a substrate 2a, a photoelectric conversion part 2b, a control line (or gate line) 2c1, a data line (or signal line) 2c2, and a bias line 2c3.

The number or the like of the photoelectric conversion part 2b, the control line 2c1, the data line 2c2, and the bias line 2c3 are not limited to the illustration.

The substrate 2a is plate-shaped, and is formed from a light transmissive material such as a non-alkali glass.

The photoelectric conversion part 2b is provided multiply on one surface of the substrate 2a.

The photoelectric conversion part 2b is rectangle-shaped, and is provided in a region drawn by the control line 2c1 and the data line 2c2. The multiple photoelectric conversion parts 2b are arranged in a matrix configuration.

One photoelectric conversion part 2b corresponds to one picture element (pixel).

Each of the multiple photoelectric conversion parts 2b is provided with a photoelectric conversion element 2b1, and a thin film transistor (TFT) 2b2 which is a switching element.

As shown in FIG. 3, a storage capacitor 2b3 which stores the signal charge converted in the photoelectric conversion element 2b1 can be provided. The storage capacitor 2b3 is, for example, rectangular flat plate-shaped, and can be provided under the respective thin film transistors 2b2. However, depending on a capacity of the photoelectric conversion element 2b1, the photoelectric conversion element 2b1 can serve as the storage capacitor 2b3.

The photoelectric conversion element 2b1 can be, for example, a photodiode or the like.

The thin film transistor 2b2 performs switching of storing and release of a charge generated by incidence of the fluorescence to the photoelectric conversion element 2b1. The thin film transistor 2b2 can include a semiconductor material such as amorphous silicon (a-Si) and polysilicon (P-Si). The thin film transistor 2b2 includes a gate electrode 2b2a, a source electrode 2b2b and a drain electrode 2b2c. The gate electrode 2b2a of the thin film transistor 2b2 is electrically connected to the corresponding control line 2c1. The source electrode 2b2b of the thin film transistor 2b2 is electrically connected to the corresponding data line 2c2. The drain electrode 2b2c of the thin film transistor 2b2 is electrically connected to the corresponding photoelectric conversion element 2b1 and the storage capacitor 2b3. The storage capacitor 2b3 and the anode side of the photoelectric conversion element 2b1 are electrically connected to the corresponding bias line 2c3 (see FIG. 3).

The control line 2c1 is provided multiply to be parallel to each other with a prescribed spacing. The control lines 2c1 extend, for example, in a row direction (corresponding to one example of a first direction).

One control line 2c1 is electrically connected to one of multiple wiring pads 2d1 provided near the periphery of the substrate 2a. One of multiple wirings provided on a flexible print board 2e1 is electrically connected to one wiring pad 2d1. Other ends of the multiple wirings provided on the flexible print board 2e1 are electrically connected to a control circuit 31 provided on the signal processing part 3.

The data line 2c2 is provided multiply to be parallel to each other with a prescribed spacing. The data lines 2c2 are, for example, in a row direction orthogonal to the column direction (corresponding to one example of a second direction).

One data line 2c2 is electrically connected to one of multiple wiring pads 2d2 provided near the periphery of the substrate 2a. One of the multiple wirings provided on a flexible print board 2e2 is electrically connected to one wiring pad 2d2. Other ends of the multiple wirings provided on the flexible print board 2e2 are electrically connected to a signal detection circuit 32 provided on the signal processing part 3.

As shown in FIG. 3, the bias line 2c3 is provided to be parallel to the data line 2c2 between the data line 2c2 and the data line 2c2.

A bias power source not shown is electrically connected to the bias line 2c3. The bias power source not shown can be provided, for example, on the signal processing part 3 or the like.

The bias line 2c3 is not always necessary, and may be provided as necessary. In the case where the bias line 2c3 is not provided, the storage capacitor 2b3 and the anode side of the photoelectric conversion element 2b1 are electrically connected to the ground in place of the bias line 2c3.

The control line 2c1, the data line 2c2, and the bias line 2c3 can be formed based on, for example, a low resistance metal such as aluminum and chromium or the like.

A protection layer 2f covers the photoelectric conversion part 2b, the control line 2c1, the data line 2c2, and the bias line 2c3.

The protection layer 2f includes, for example, at least one of an oxide insulating material, a nitride insulating material, an oxynitride insulating material, or a resin material.

The oxide insulating material is, for example, a silicon oxide, and an aluminum oxide or the like.

The nitride insulating material is, for example, a silicon nitride, and an aluminum nitride or the like.

The oxynitride insulating material is, for example, a silicon oxynitride or the like.

The resin material is, for example, an acrylic resin.

The signal processing part 3 is provided on an opposite side to a side of the scintillator 5 of the array substrate 2.

The signal processing part 3 is provided with the control circuit 31, and the signal detection circuit 32.

The control circuit 31 switches between an on state and an off state of the thin film transistor 2b2.

As shown in FIG. 2, the control circuit 31 includes multiple gate drivers 31a and a row selection circuit 31b.

A control signal S1 is input from the image processing part 4 or the like to the row selection circuit 31b. The row selection circuit 31b inputs the control signal S1 to the corresponding gate driver 31a in accordance with a scanning direction of the X-ray image.

The gate driver 31a inputs the control signal S1 to the corresponding control line 2c1.

For example, the control circuit 31 inputs the control signal S1 sequentially for each control line 2c1 via the flexible printed board 2e1 and the control line 2c1. The thin film transistor 2b2 is turned on by the control signal S1 input to the control line 2c1, and the signal charge (image data signal S2) from the photoelectric conversion element 2b1 can be received.

The signal detection circuit 32 detects a current integral value via the data line 2c2 and detects a current integral value from a reference potential part 6a when the thin film transistor 2b2 is in the off state.

The signal detection circuit 32 reads out the signal charge (image data signal S2) from the photoelectric conversion element 2b1 in accordance with a sampling signal from the image processing part 4 when the thin film transistor 2b2 is in the on state.

The image processing part 4 is electrically connected to the signal detection circuit 32 via a wiring 4a and a determination part 6b. The image processing part 4 may be integrated with the signal processing part 3.

The X-ray image is configured as follows.

First, the thin film transistors 2b2 are sequentially turned on by the control circuit 31. The thin film transistors 2b2 is turned on, and thus a certain amount of charges are stored in the photoelectric conversion element 2b1 via the bias line 2c3. Next, the thin film transistors 2b2 are turned off. If the X-ray is applied, the X-ray is converted to the fluorescence by the scintillator 5. If the fluorescence is incident on the photoelectric conversion element 2b1, a charge (electron or hole) is generated by a photoelectric effect, the generated electron and the stored charge (heterogeneous charge) couple, and the stored charges decrease. Next, the control circuit 31 turns on the thin film transistors 2b2 sequentially. The signal detection circuit 32 reads out the reduced charges (image data signal S2) stored in the respective photoelectric conversion elements 2b1 via the data lines 2c2 in accordance with the sampling signal.

The image processing part 4 receives the read out image data signal S2, amplifies sequentially the received image data signal S2, and converts the amplified image data signal S2 (analog signal) to a digital signal. The image processing part 4 configures the X-ray image on the basis of the image data signal S2 converted to the digital signal. The data of the configured X-ray image are output from the image processing part 4 toward an external equipment.

The scintillator 5 is provided on the multiple photoelectric conversion elements 2b1, and converts the incident X-ray to visible light, namely the fluorescence. The scintillator 5 is provided to cover a region (effective pixel region) where the multiple photoelectric conversion parts 2b on the substrate 2a are provided.

The scintillator 5 can be formed based on, for example, a cesium iodide (CsI):thallium (TI), or a sodium iodide (NaI):thallium (TI) or the like. In this case, if the scintillator 5 is formed by using a vacuum deposition method or the like, the scintillator 5 comprising multiple columnar crystal aggregations is formed.

A thickness dimension of the scintillator 5 can be, for example, about 600 μm.

The scintillator 5 can be also formed based on, for example, gadolinium oxysulfide ($Gd_2O_2S$) or the like. In this case, for example, the scintillator 5 can be formed as follows. First, particles made from gadolinium oxysulfide are mixed with a binder material. Next, the mixed material is coated to cover the effective pixel region. Next, the coated material is fired. Next, grooves are formed in the fired material using a blade dicing method or the like. At this time, the grooves in a matrix configuration can be formed so that the square pillar-shaped scintillator 5 is provided every multiple photoelectric conversion elements 5. The grooves can be filled with atmosphere (air) or inactive gas such as antioxidant nitrogen gas or the like. The grooves may be in a vacuum state.

Other, in order to increase a utilization efficiency of the fluorescence and improve sensitivity characteristics, a reflection layer not shown can be provided so as to cover a surface side (incident surface side of X-ray) of the scintillator 5.

In order to suppress the characteristics of the scintillator 5 and the characteristics of the reflection layer not shown from being deteriorated by water vapor included in air, a moisture proof body not shown covering the scintillator 5 and the reflection layer not shown can be provided.

Here, a general signal detector reads out the signal charge as follows. First, the detector detects incidence of the X-ray by an external signal from the external equipment such as the X-ray source or the like. Next, after the predetermined time (time necessary for the signal charge being stored) has passed, the thin film transistor 2b2 of the photoelectric conversion element 2b performing reading is turned on, and the detector reads out the stored charge.

That is, in the case of the general X-ray detector, direct incidence of the X-ray to the X-ray detector is not always detected.

For that reason, a prescribed time is necessary to be provided between a time when the signal from the external equipment is input and a time when reading operation is started. Furthermore, an external circuit making synchronizing the signal from the external equipment (for example, a signal notifying X-ray radiation from the X-ray source or the like) is necessary. If the external circuit is provided, it is susceptible to the noise or the like, when the circuit synchronization with the X-ray irradiation is impossible, the X-ray image may be impossible to be acquired.

Here, when a substance is irradiated with the X-ray, an electron (photoelectron) is emitted from a surface of the substance (photoelectric effect). For that reason, if the member made from an insulating material or a semiconductor material is irradiated with the X-ray, the electron is caused to be generated in the member due to the photoelectric effect, a voltage is applied to both ends of the member, and an electric field is applied inside the member, a current (X-ray photoconductive current) can be taken out during a period when the X-ray is being irradiated. The previously described X-ray detector of the direct conversion method is based on this.

Also in the X-ray detector of the indirect conversion method, when the thin film transistor 2b2 as the semiconductor element is irradiated with the X-ray, a current flows due to the photoelectric effect between the drain electrode 2b2c and the source electrode 2b2b. That is, the thin film transistor 2b2 is irradiated with the X-ray, a resistance value decreases and the thin film transistor 2b2 is turned on apparently. For that reason, the incidence start time of the X-ray can be directly detected based on this.

Figure 4:
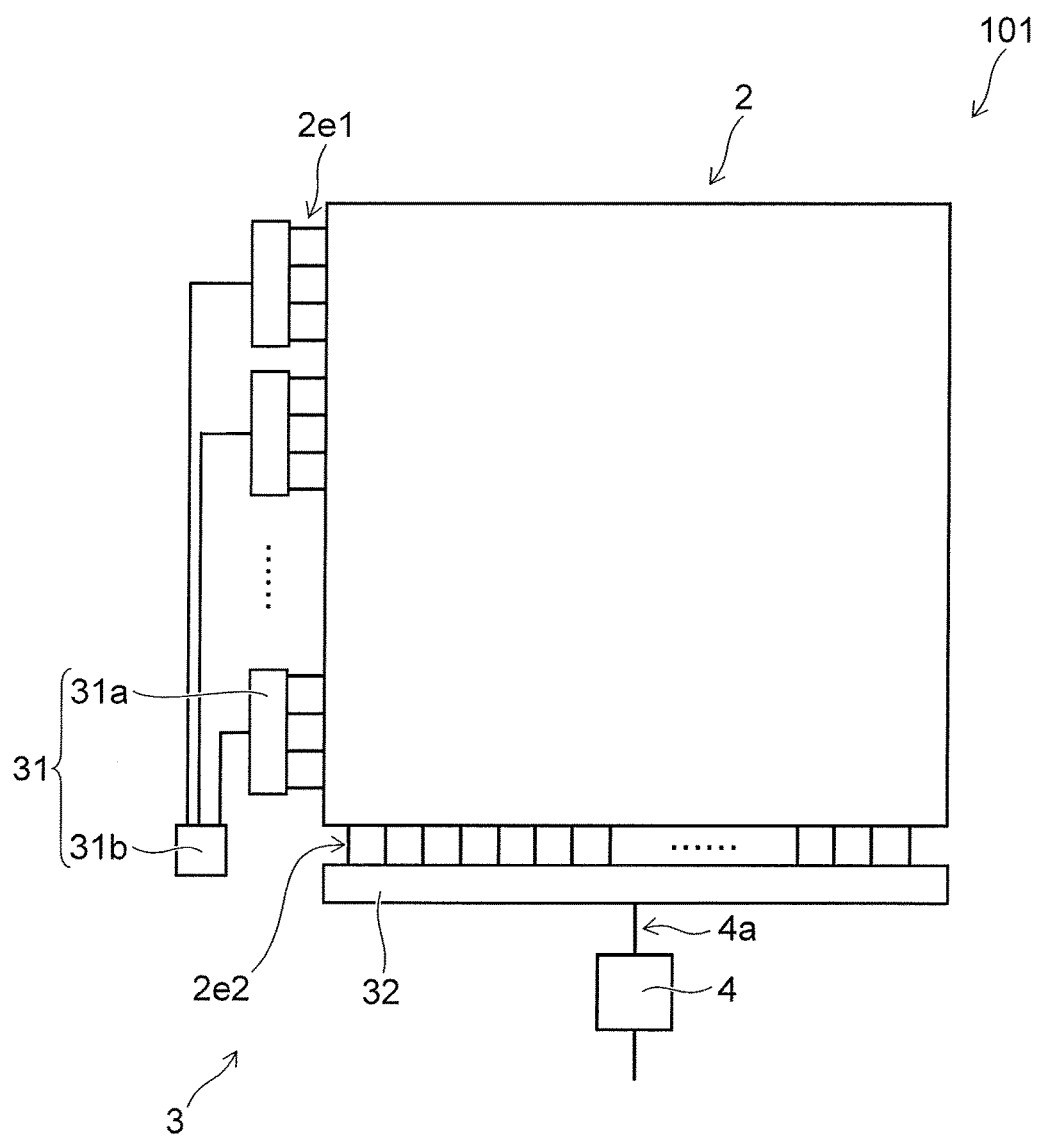
FIG. 4 is a block diagram of an X-ray detector according to a reference example.

FIG. 4 is a block diagram of an X-ray detector 101 according to a reference example.

As shown in FIG. 4, the X-ray detector 101 is provided with the array substrate 2 and the signal processing part 3. Although not shown, the image processing part 4 and the scintillator 5 are also provided. However, the X-ray detector 101 is not provided with the incident radiation detection part 6.

In the X-ray detector 101, the incidence start time of the X-ray is detected as follows.

First, the respective thin film transistors 2b2 are turned off. The current integral values of the respective data lines 2c2 are detected by the signal processing part 3 or the like. The current integral values are sequentially detected for each of the multiple photoelectric conversion parts 2b electrically connected to the data lines 2c2. The detection of the current integral values like this is repeatedly performed. A difference between the detected current integral value and the current integral value detected once a time before is obtained by a comparison circuit or the like, a time when the difference of the current integral values changes is detected, and the time when the difference of the current integral values changes is detected is determined to be the incidence start time of the X-ray. In this way, the incidence start time of the X-ray can be directly detected.

However, if, during the period when the current integral value from the photoelectric conversion part 2b is being detected (period when the signal charge is read out), there is a disturbance noise such as a low frequency noise, the disturbance noise overlaps the detected current integral value. The influence of the disturbance noise appears, for example, in a row pixel units on the X-ray image. Such influence of the disturbance noise is called as a lateral noise.

In the detection method of the incidence start time of the X-ray according to the reference example, the difference between the detected current integral value and the current integral value detected once a time before is obtained. In this case, if there is the lateral noise previously described, the detected current integral value further overlaps off set. As a result, this causes a factor of erroneous determination in the determination of the incidence start time of the X-ray. In this case, if the obtained difference of the current integral values is integrated in order to increase the signal, the influence of the lateral noise also increases, and further increases the possibility that the erroneous determination occurs more.

Figure 5:
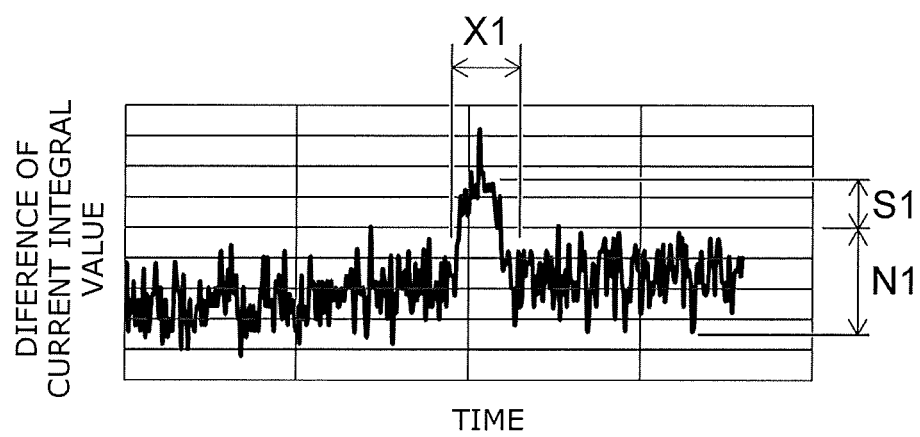
FIG. 5 is a graph view for illustrating a change of a difference of current integral values in a detection method of an incidence start time of the X-ray according to the reference example.

FIG. 5 is a graph view for illustrating the change of the difference of the current integral values in the detection method of the incidence start time of the X-ray according to the reference example.

X1 in FIG. 5 is a pulse width of the incident X-ray. N1 is a noise. S1 is an effective electrical signal available for determination of the incidence start time of the X-ray.

As known from FIG. 5, if the X-ray is incident, the difference of the current integral values increases. For that reason, the incidence start time of the X-ray can be detected by detecting the change of the difference of the current integral values.

However, as described above, the influence of the disturbance noise increases. In this case, because the difference between the current integral values of the same photoelectric conversion part 2b is obtained, the obtained difference of the current integral values becomes small. For that reason, the value of the effective electrical signal S1 is likely to be small, and thus the erroneous determination of the determination of the incidence start time of the X-ray is more likely to occur.

Then, the X-ray detector 1 according to the embodiment is provided with the incident radiation detection part 6.

As shown in FIG. 1 and FIG. 2, the incident radiation detection part 6 includes the reference potential part 6a and the determination part 6b.

The reference potential part 6a can be, for example, electrically connected to a power source such as a constant voltage power source or a constant current power source. The reference potential part 6a may be not electrically connected to the power source or the like, and may be also electrically connected to a float potential.

The determination part 6b is electrically connected to the reference potential part 6a via the signal detection circuit 32.

The reference potential part 6a and the determination part 6b can be provided in a region where the X-ray is not incident. The reference potential part 6a and the determination part 6b can be, for example, provided in a region where the signal processing part 3 or the image processing part is provided. The reference potential part 6a and the determination part 6b can be also integrated with the signal processing part 3 or the image processing part 4.

Figure 6A:
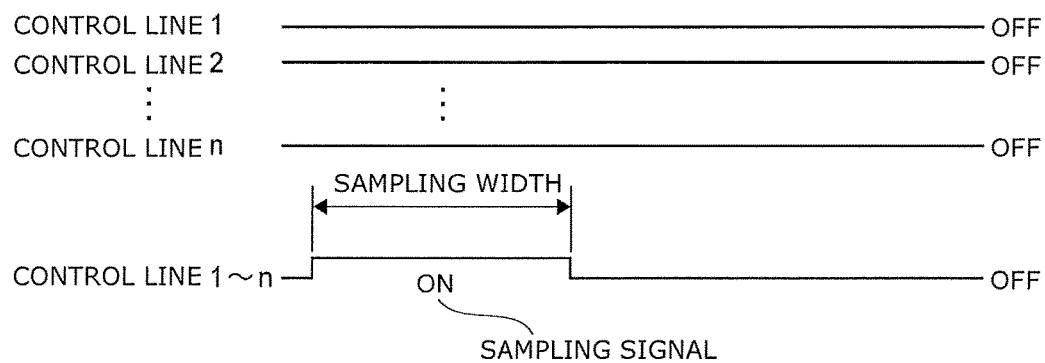
FIGS. 6A, 6B are timing charts for illustrating a processing step in the X-ray detector.
Figure 6B:
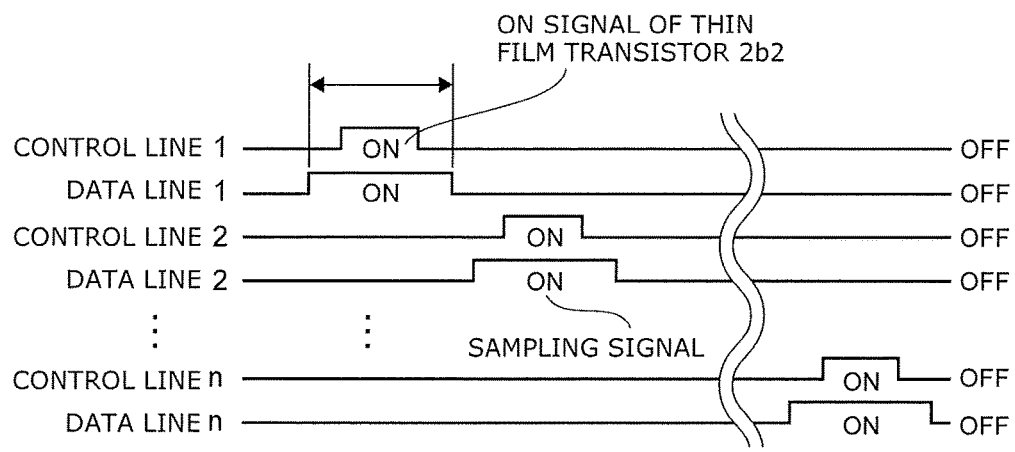

FIGS. 6A, 6B are timing charts for illustrating a process step in the X-ray detector 1.

FIG. 6A is a timing chart for illustrating the detection of the incidence start time of the X-ray.

FIG. 6B is a timing chart for illustrating a process step after the incidence of the X-ray starts.

Figure 7:
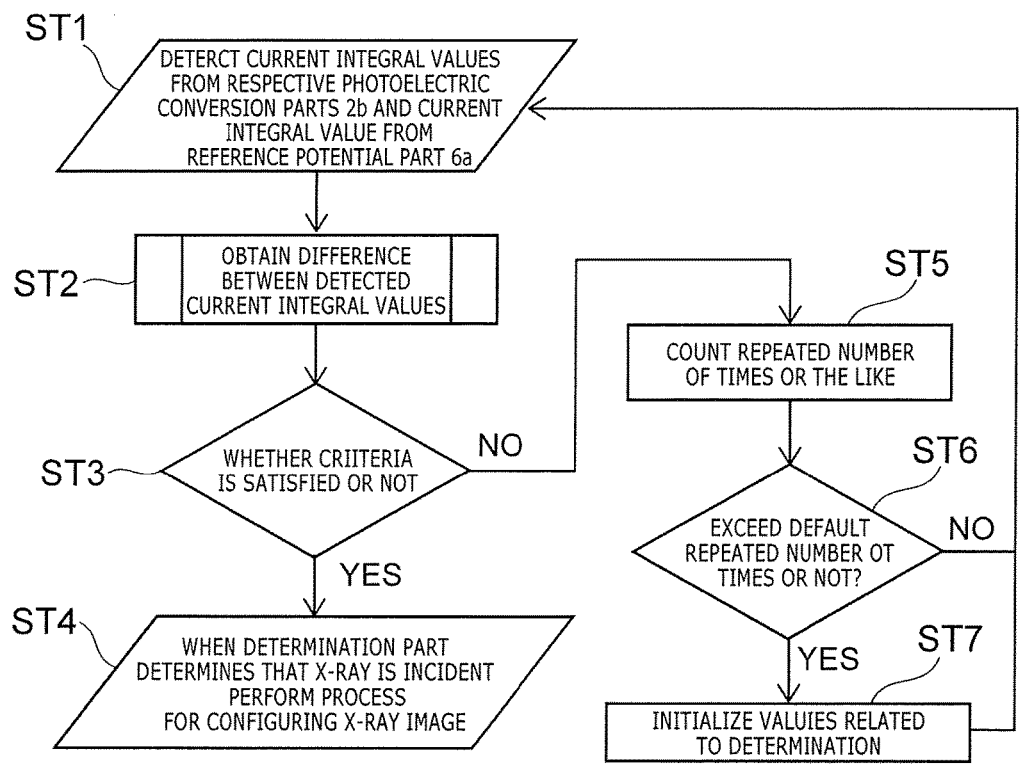
FIG. 7 is a flow chart for illustrating detection of the incidence start time of the X-ray.

FIG. 7 is a flow chart for illustrating the detection of the incidence start time of the X-ray.

As shown in FIG. 6A and FIG. 7, in the case where the incidence start time of the X-ray is detected, first, the control circuit 31 is caused not to input the control signal S1 (voltage) to all control lines 2c1. That is, all thin film transistors 2b2 are turned off. Subsequently, sampling signals are sequentially input from the image processing part 4 to the signal processing part 3, and sampling is started. As previously described, if the photoelectric conversion part 2b is irradiated with the X-ray, a current flows between the drain electrode 2b2c and the source electrode 2b2b due to the photoelectric effect. The detection of the current integral values from the respective photoelectric conversion parts 2b are finished within the respective sampling widths. The current integral value from the reference potential part 6a is detected within the respective sampling widths (step ST1 of FIG. 7).

Next, the determination part 6b obtains the difference between the current integral values from the respective photoelectric conversion parts 2b and the current integral value from the reference potential part 6a (step ST2 of FIG. 7).

Next, the determination part 6b determines whether the obtained difference of the current integral values satisfies the criteria (step ST3 of FIG. 7).

When the criteria are satisfied, the determination part 6b determines that the X-ray is incident. When the criteria are not satisfied, the determination part 6b determines that the X-ray is not incident.

When the determination part 6b determines that the X-ray is incident, a process for configuring the X-ray image illustrated in FIG. 6(b) is performed (step ST4 of FIG. 7).

For example, as shown in FIG. 6(b), the sampling signal is input sequentially from the image processing part 4 to the signal processing part 3, and the sampling is started.

Next, the control circuit 31 inputs the control signal S1 to the control lines 2c1 in the respective sampling widths after a certain period of time. That is, the control circuit 31 turns on the thin film transistor 2b2 performing the sampling after a certain period of time.

"A certain period of time" can be a time predetermined by an experiment or simulation. In this case, "a certain period of time" can be set fixedly, and can be also set each time before irradiation of the X-ray.

"A certain period of time" can be also taken as a time when the detected value exceeds a first threshold and is less than a second threshold.

The input control signal S1 is finished within the sampling width. When the thin film transistor 2b2 is turned on by the control signal S1, the signal charge (image data signal S2) from the photoelectric conversion element 2b1 can be received. The image data signal S2 read out from the signal detection circuit 32 passes the determination part 6b to be input to an image processing part 4. The image processing part 4 sequentially amplifies the input image data signal S2, and converts to the digital signal. The image processing part 4 configures the X-ray image on the basis of the image data signal S2 converted to the digital signal. The data of the configured X-ray image are output from the image processing part 4 toward the external equipment.

When it is determined by the determination part 6b that the X-ray is not incident, at least one of the repeated number of times (number of times of determination) of steps up to the determination (step ST1 to step ST3) and elapsed time is detected (step ST5 of FIG. 7).

Next, it is determined whether at least one of number of times of detected determination and the elapsed time exceeds the specified value or not (step ST6 of FIG. 7).

If the number of times of the detected determination or the like does not exceed the specified value, the process returns to step ST1 and the previously described steps are performed again.

That is, the control circuit 31 maintains the multiple thin film transistors 2b2 in the off state.

The signal detection circuit 32 detects again the current integral values from the respective photoelectric conversion parts 2b and the current integral value from the reference potential part 6a.

The determination part 6b determines again the incidence start time of the X-ray on the basis of the difference between the current integral values from the respective photoelectric conversion parts 2b and the current integral value from the reference potential part 6a.

If the number of times of the detected determination or the like exceeds the specified value, the data related to the determination (data about the number of times of determination, the elapsed time, the detected current integral value or the like) are initialized (deleted), and the process returns to the step ST1 and the previously described steps are performed again.

Figure 8:
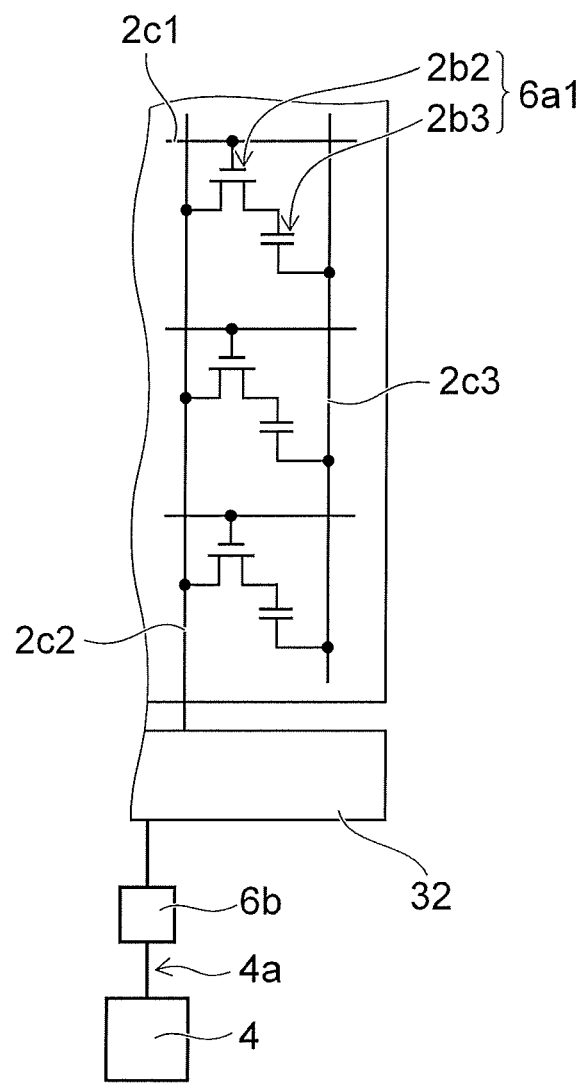
FIG. 8 is a block diagram for illustrating a reference potential part according to other embodiment.

FIG. 8 is a block diagram for illustrating a reference potential part 6a1 according to other embodiment.

As shown in FIG. 8, the reference potential part 6a1 is provided with the thin film transistor 2b2 and the storage capacitor 2b3. That is, the reference potential part 6a1 has the configuration excepting the photoelectric conversion element 2b1 from the photoelectric conversion part 2b.

The reference potential part 6a1 may include only the thin film transistor 2b2.

The reference potential part 6a1 may not electrically connect the drain electrode 2b2c to the bias line 2c3, and may form an insulating substance in place of the photoelectric conversion element 2b1.

The reference potential part 6a1 is provided in a region drawn by the control lines 2c1 and the data lines 2c2 in a peripheral region of the array substrate 2. The multiple reference potential parts 6a1 are provided to be arranged in a direction in which the control lines are arranged. Electrical connection between the thin film transistors 2b2 and the storage capacitors 2b3 can be made the same as the case of the photoelectric conversion part 2b.

As previously described, when the thin film transistor 2b2 is irradiated with the X-ray, a current flows between the drain electrode 2b2c and the source electrode 2b2b due to the photoelectric effect. In this case, if the photoelectric conversion element 2b1 is not provided, the current flowing between the drain electrode 2b2c and the source electrode 2b2b is almost constant. The reference potential part 6a1 is based on this phenomenon.

A configuration difference between the reference potential part 6a1 and the photoelectric conversion part 2b is only absence or not of the photoelectric conversion element 2b1, and thus the reference potential part 6a1 can be formed in the step of forming the photoelectric conversion part 2b. For that reason, the cost reduction of manufacturing and the productivity improvement can be made.

The reference potential part 6a1 can be provided on the array substrate 2. For that reason, space saving, furthermore downsizing of the X-ray detector 1 can be made.

The reference potential part can be also based on the multiple photoelectric conversion parts 2b provided in an arbitrary column of the multiple photoelectric conversion parts 2b arranged in a matrix configuration.

That is, the reference potential part can be the one column multiple photoelectric conversion parts 2b provided in a direction in which the multiple control lines 2c1 are arranged of the multiple photoelectric conversion parts 2b arranged in a matrix configuration.

In this case, since the photoelectric conversion part 2b for detection the X-ray image is different from the photoelectric conversion part 2b serving as the reference potential part, detection periods of the current integral values are not shifted as in the detection method of the incidence start time of the X-ray according to the reference example described above. For that reason, the influence of the disturbance noise does not become large.

In this way, since the photoelectric conversion part 2b for detecting the X-ray image and the photoelectric conversion part 2b serving as the reference potential part have the completely same configuration, the cost reduction of manufacturing and the productivity improvement can be further made.

Figure 9:
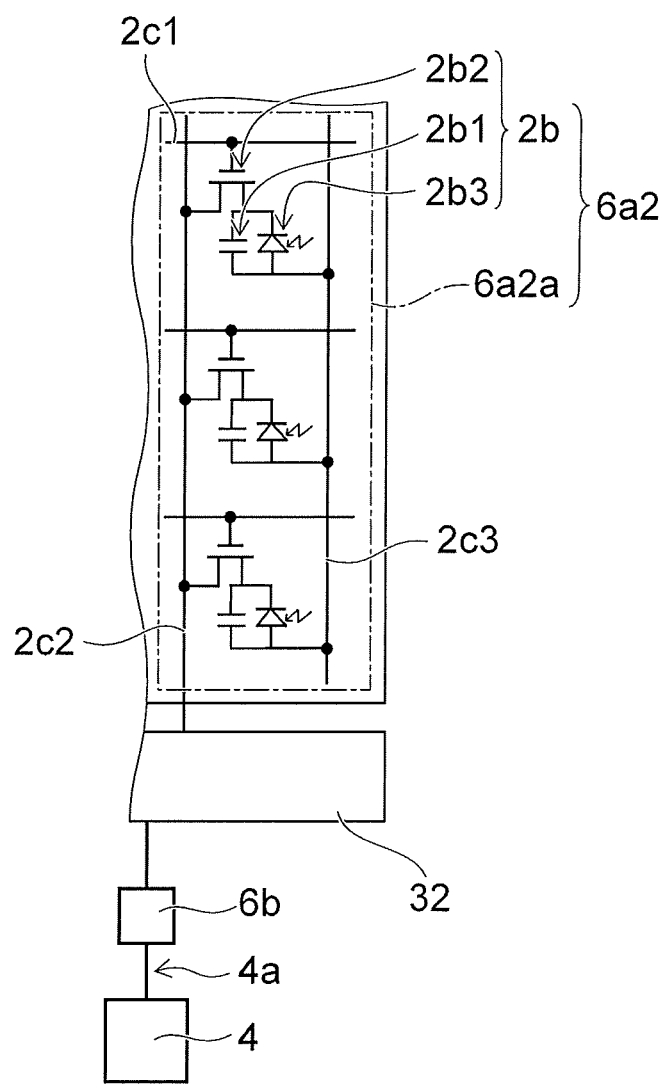
FIG. 9 is a block diagram for illustrating a reference potential part according to other embodiment.

FIG. 9 is a block diagram for illustrating a reference potential part 6a2 according to other embodiment.

As shown in FIG. 9, the reference potential part 6a2 includes the multiple photoelectric conversion parts 2b serving as the reference potential part previously described and a shielding member 6a2a covering those.

In the case where the scintillator 5 is not provided on the photoelectric conversion part 2b serving as the reference potential part 6a2, the shielding member 6a2a is formed of a material with a high X-ray absorption rate. The material with the high X-ray absorption rate can be, for example, a heavy metal such as lead, copper, iron or the like. In the case where the scintillator 5 is provided on the photoelectric conversion part 2b serving as the reference potential part 6a2, the shielding member 6a2a made of the material with the high X-ray absorption rate can be provided on an incidence side of the X-ray of the scintillator 5. In the case where the shielding member 6a2a is provided between the scintillator 5 and the array substrate 2, the shielding member 6a2a can be formed of a material capable of shielding the fluorescence from the scintillator 5. The material capable of shielding the fluorescence can be appropriately selected from, for example, a metal material, an inorganic material, an organic material or the like.

The shielding material 6a2a covering the photoelectric conversion part 2b is illustrated, however the shielding material 6a2a covering the reference potential part 6a1 illustrated in FIG. 8 can be also provided.

If the shielding member 6a2a is provided, the X-ray or the fluorescence is not incident on the photoelectric conversion part 2b below that. Alternately, the X-ray is not incident on the reference potential part 6a1 below the shielding member 6a2a. For that reason, when the X-ray detector 1 is irradiated with the X-ray, a current can be suppressed from being generated in the photoelectric conversion part 2b and the reference potential part 6a1 provided below the shielding member 6a2a. That is, the potential serving as the reference can be almost zero.

In the case where the reference potential part is provided on the array substrate 2, considering the influence on the X-ray image to be obtained, it is preferable to provide the reference potential part in the peripheral region of the array substrate 2. It is because that, in imaging the X-ray image, a center region is used for imaging a more important portion, and the peripheral region is used for relatively less important imaging such as positioning or the like.

Figure 10:
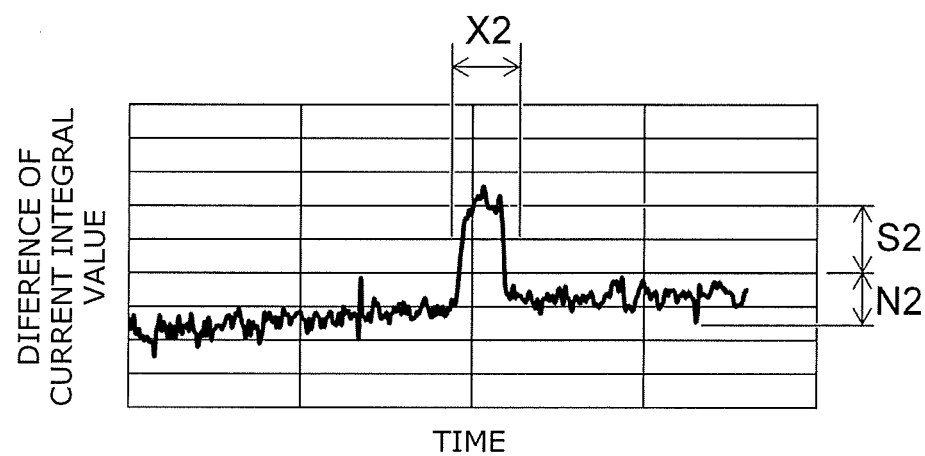
FIG. 10 is a graph view for illustrating an effect of an incident radiation detection part.

FIG. 10 is a graph view for illustrating the effect of the incident radiation detection part 6.

FIG. 10 shows the case where the reference potential part 6a2 illustrated in FIG. 9, namely, the shielding member 6a2a is provided.

X2 in FIG. 10 is a pulse width of the incident X-ray. N2 is a noise. S2 is an effective electrical signal available for the determination of the incidence start time of the X-ray.

As known from FIG. 10, when the X-ray is incident, the difference of the current integral values increases. For that reason, if the difference of the current integral values is detected, the incidence start time of the X-ray can be detected.

As described previously, in the detection method of the incidence start time of the X-ray according to the reference example, the difference between the detected current integral value and the current integral value detected once a time before is obtained. For that reason, it results in increase of the disturbance noise due to the lateral noise or the like.

On the contrary, if the incident radiation detection parts 6 (reference potential parts 6a, 6a1, 6a2) are provided, the difference between the current integral values from the photoelectric conversion part 2b detected at almost the same time and the current integral value from the reference potential part 6a can be obtained. If the current integral values detected at almost the same time are detected, they are equal to the disturbance noise included in the detected current integral value, and thus the disturbance noise can be compensated when obtaining the difference of the current integral values. That is, in-phase noise can be removed.

As a result, for example, as is apparent from the comparison between FIG. 10 and FIG. 5, the noise N2 becomes small compared with the noise N1. For that reason, the value of the effective electrical signal S2 is possible to be large. In the case of the illustration in FIG. 5, the S/N ratio is 5 times as compared with the illustration in FIG. 10.

Figure 11:
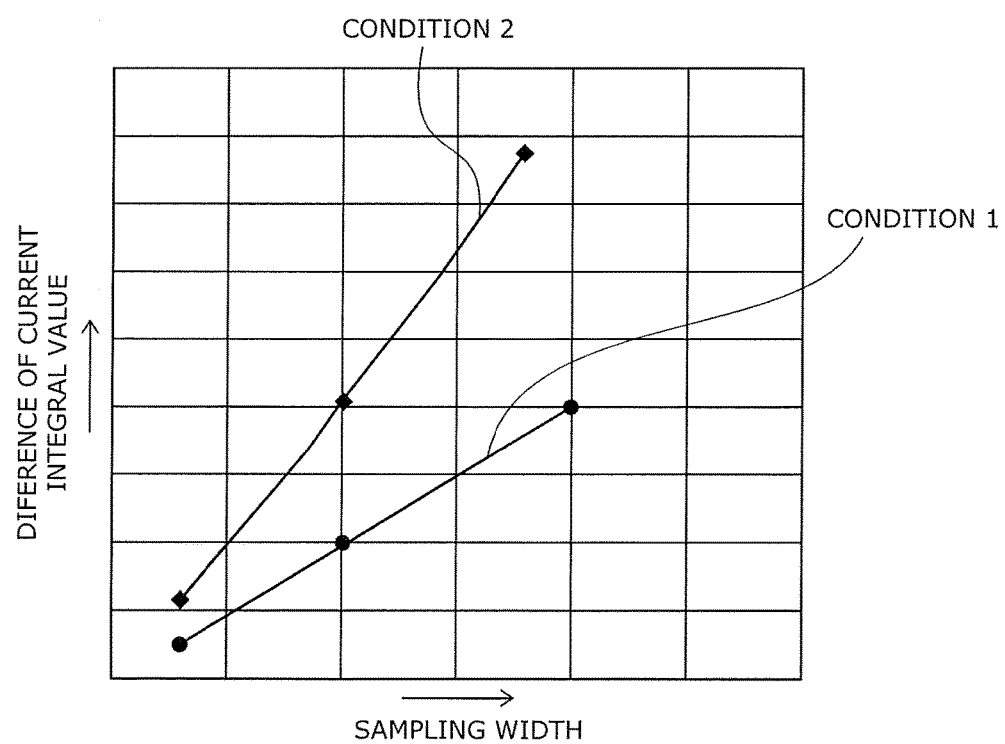
FIG. 11 is a graph view for illustrating a relationship between a sampling width in a detection step of a current from a photoelectric conversion part in an off state of a thin film transistor and an obtained difference of the current integral values.

FIG. 11 is a graph view for illustrating a relationship between a sampling width in a detection step of the current from the photoelectric conversion part 2b in the off state of the thin film transistor 2b2 and the obtained difference of the current integral values.

The horizontal axis represents the sampling width, and the vertical axis represents the obtained difference of the current integral values.

The condition 2 in FIG. 11 is for the case where an X-ray tube current which is twice an X-ray tube current in the condition 1 is applied to the X-ray source.

As seen from FIG. 11, the obtained difference of the current integral values increases in proportion to the X-ray tube current. The obtained difference of the current integral values can be also increased by increasing the sampling width.

For that reason, the signal detection circuit 32 changes the sampling width in the on state of the thin film transistor 2b2 and the sampling width in the off state of the thin film transistor 2b2 in order to improve the S/N ratio.

In this case, the signal detection circuit 32 makes the sampling width when the thin film transistor 2b2 is in the off state longer than the sampling width when the thin film transistor 2b2 is in the on state.

In the detection method of the incidence start time of the X-ray according to the reference example, this phenomenon is taken as the change of a floating coupling capacitance between the drain electrode 2b2c and the source electrode 2b2b. That is, the change of the floating coupling capacitance in the case of the irradiation of the X-ray is detected as a voltage, and the difference of the current integral values obtained at this time is assumed to increase in proportion to the number of the photoelectric conversion parts 2b irradiated with the X-ray and electrically connected to the control lines 2c1.

However, actually, as shown in FIG. 11, the obtained difference of the current integral values increases in proportion to the sampling width. This can be understood as follows. Even if the thin film transistor 2b2 is in the off state, when the thin film transistor 2b2 is irradiated with the X-ray, a current flows between the drain electrode 2b2c and the source electrode 2b2b due to the photoelectric effect, and the current continues to flow in the data lines 2c2, and thus the obtained difference of the current integral values increases in proportion to the sampling width.

Figure 12:
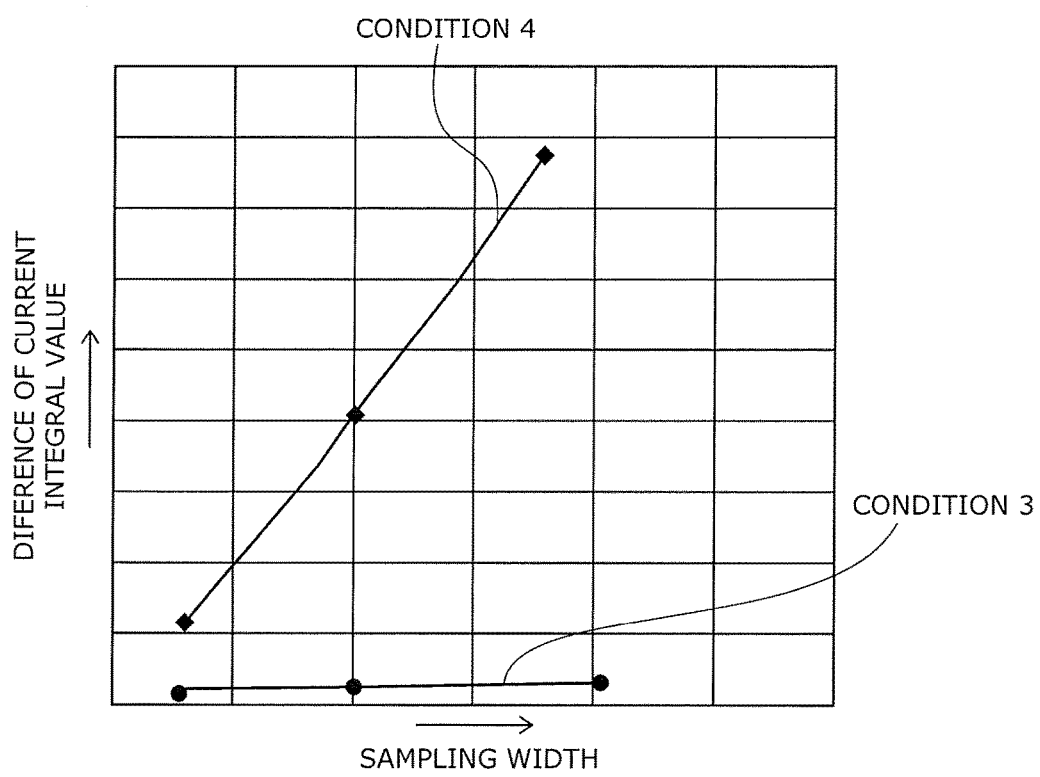
FIG. 12 is a graph view for illustrating a relationship between a sampling width in a detection step of a current from a photoelectric conversion part in an off state of a thin film transistor and an obtained difference of the current integral values.

FIG. 12 is a graph view for illustrating a relationship between a sampling width in a detection step of the current from the photoelectric conversion part 2b in the off state of the thin film transistor 2b2 and the obtained difference of the current integral values.

The condition 3 in FIG. 12 is for the case where the drain electrode 2b2c is not electrically connected to the bias line 2c3 in the reference potential part 6a1 illustrated in FIG. 8. In this case, in the reference potential part 6a1, an insulating substance is formed as a film in place of the photoelectric conversion element 2b1. The condition 4 is for the case where the reference potential part is the one column multiple photoelectric conversion elements 2*b* provided in a direction in which the multiple control lines 2*c*1 are arranged.

The irradiation condition of the X-ray is assumed to be the same.

As seen from FIG. 12, the obtained difference of the current integral values also changes depending on the configuration of components connected to the drain electrode 2*b*2*c*. In the condition 3 where the drain electrode 2*b*2*c* is not electrically connected to the bias line 2*c*3, the obtained difference of the current integral values becomes extremely small. This is considered that the current is hard to flow due to no voltage application from the bias line 2*c*3.

In this way, if the reference potential part Ga1 not provided with the photoelectric conversion element 2*b*1 is used, the level of the obtained difference of the current integral values does not almost vary, and the in-phase noise can be removed. For that reason, the S/N ratio can be improved, and additionally the erroneous determination can be suppressed.

The above is the same for the cases of the reference potential part 6*a* and the reference potential part 6*a*2.

Generally, the X-ray intensity tends to decrease from the center region toward the peripheral region. For that reason, if the column of the photoelectric conversion parts 2*b* in the peripheral region is assumed to be the reference potential part, the effect illustrated in FIG. 12 is obtained.

In the case where the column of the photoelectric conversion parts 2*b* in the center region is the reference potential part, it is sufficiently possible to obtain the similar effect by devising criteria.

The in-phase noise can be removed even if in the case of the reference potential part 6*a*.

As described in FIG. 11, the obtained difference of the current integral values is proportion to the sampling width. For that reason, if the sampling width is made long, the obtained difference of the current integral values can be large, and thus the S/N ration can be further improved.

In the signal detection circuit 32, the current integral values may be different for each of the data lines 2*c*2.

In this case, the determination part 6*b* averages the current integral values for each of the multiple data lines 2*c*2 and determines the incidence start time of the X-ray on the basis of the difference between the averaged current integral value and the current integral value from the reference potential part.

As described above, since the X-ray detector 1 according to the embodiment includes the incident radiation detection part 6, the difference between the current integral values from the photoelectric conversion part 2*b* detected at almost the same time and the current integral value from the reference potential part 6*a* can be obtained. If the current integral values are detected at almost the same time, they are equal to the disturbance noise included in the detected current integral value, and thus the disturbance noise can be compensated when obtaining the difference of the current integral values. That is, the in-phase noise can be removed. For that reason, since the S/N ratio can be greatly improved, the erroneous determination can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector comprising:
a substrate;
a plurality of control lines provided on the substrate and extending in a first direction;
a plurality of data lines provided on the substrate and extending in a second direction crossing the first direction;
a photoelectric conversion part provided in each of a plurality of regions drawn by the plurality of control lines and the plurality of data lines, and including a thin film transistor and a photoelectric conversion element electrically connected to a corresponding control line and a corresponding data line;
a control circuit electrically connected to the plurality of control lines, and switching an on state and an off state of the thin film transistors;
a signal detection circuit electrically connected to the plurality of data lines;
at least one reference potential part electrically connected to the signal detection circuit; and
a determination part electrically connected to the signal detection circuit,
the signal detection circuit detecting a first current integral value via the data lines and detecting a second current integral value from the at least one reference potential part in the off state of the thin film transistors, and
the determination part determining an incidence start time of a radiation on the basis of a difference between the detected first current integral value and the detected second current integral value.

2. The detector according to claim 1, wherein
the at least one reference potential part is provided in a region where the radiation is incident.

3. The detector according to claim 2, wherein
The at least one reference potential part is provided in a peripheral region of the substrate.

4. The detector according to claim 2, wherein
the reference potential part includes the thin film transistor electrically connected to a corresponding control line and a corresponding data line.

5. The detector according to claim 4, wherein
the reference potential part further includes a shielding member covering the thin film transistor provided on the reference potential part.

6. The detector according to claim 5, wherein
The shielding member includes at least one selected from lead, copper or iron.

7. The detector according to claim 2, wherein
a plurality of the reference potential parts are one column of a plurality of the photoelectric conversion parts provided in a direction in which the control lines are arranged of the photoelectric conversion parts arranged in a matrix configuration.

8. The detector according to claim 7, wherein
the plurality of the reference potential parts further include a shielding member covering a plurality of the photoelectric conversion parts provided on a plurality of the reference potential parts.

9. The detector according to claim 8, wherein
The shielding member includes at least one selected from lead, copper or iron.

10. The detector according to claim 8, further comprising:
a scintillator covering the photoelectric conversion parts,
the shielding member shielding fluorescence from the scintillator.

11. The detector according to claim 1, wherein
the at least one reference potential part and the determination part are provided in a region where the radiation is not incident.

12. The detector according to claim 11, wherein
the at least one reference potential part is electrically connected to a power source or a float potential.

13. The detector according to claim 1, wherein
the at least one reference potential part and the determination part are provided in a region where the signal detection circuit is provided.

14. The detector according to claim 13, wherein
the at least one reference potential part is electrically connected to a power source or a float potential.

15. The detector according to claim 1, wherein
the signal detection circuit changes a sampling width in the on state of the thin film transistors and a sampling width in the off state of the thin film transistors.

16. The detector according to claim 15, wherein
the sampling width in the off state of the thin film transistors is longer than the sampling width in the on state of the thin film transistors.

17. The detector according to claim 1, wherein
when the determination part determines that the radiation incidence starts, the control circuit turns on the plurality of thin film transistors after a certain period of time.

18. The detector according to claim 1, wherein
when the determination part determines that the radiation incidence does not start,
the control circuit maintains the plurality of thin film transistors in the off state,
the signal detection circuit detects again the first current integral value and the second current integral value, and
the determination part determines again the incidence start time of the radiation on the basis of a difference between the first current integral value detected again and the second current integral value detected again.

19. The detector according to claim 18, wherein
the determination part detects at least one of number of times of determination or elapsed time, and when at least one of the detected number of times of the determination or the elapsed time exceeds a specified value,
data about the number of times of the determination, the elapsed time, the first current integral value and the second current integral value are initialized.

20. The detector according to claim 1, wherein
the determination part averages the first current integral value for each of the plurality of data lines, and determines the incidence start time of the radiation on the basis of a difference between the second current integral value and the averaged first current integral value.

* * * * *